US012230855B2

(12) United States Patent
Yasuda et al.

(10) Patent No.: US 12,230,855 B2
(45) Date of Patent: Feb. 18, 2025

(54) WAVEGUIDE STRUCTURE AND METHOD FOR MANUFACTURING WAVEGUIDE STRUCTURE

(71) Applicant: FUJIFILM CORPORATION, Tokyo (JP)

(72) Inventors: Hideki Yasuda, Kanagawa (JP);
Ichihiko Hashimoto, Kanagawa (JP);
Kazuhiro Yokoi, Santa Clara, CA (US);
Yohei Takahashi, Santa Clara, CA (US); Koki Takahashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 333 days.

(21) Appl. No.: 17/804,602

(22) Filed: May 31, 2022

(65) Prior Publication Data

US 2022/0367999 A1 Nov. 17, 2022

Related U.S. Application Data

(63) Continuation of application No. PCT/JP2020/038187, filed on Oct. 8, 2020.
(Continued)

(51) Int. Cl.
*H01P 1/22* (2006.01)
*H01P 3/08* (2006.01)
(Continued)

(52) U.S. Cl.
CPC .............. *H01P 3/081* (2013.01); *H01P 1/227* (2013.01); *H01P 7/08* (2013.01); *H01P 11/001* (2013.01); *H05K 9/0081* (2013.01)

(58) Field of Classification Search
CPC .. H01P 1/227; H01P 1/22; H01P 1/268; H01P 1/26; H01P 1/24; H01P 3/08;
(Continued)

(56) References Cited

U.S. PATENT DOCUMENTS

| 2010/0156573 A1 | 6/2010 | Smith et al. |
| 2010/0201459 A1* | 8/2010 | Kawaguchi ............... H01P 3/08 333/204 |

(Continued)

FOREIGN PATENT DOCUMENTS

| JP | 2000-101204 A | 4/2000 |
| JP | 2002-317280 A | 10/2002 |

(Continued)

OTHER PUBLICATIONS

JP2000101204A translation (Year: 2000).*
(Continued)

*Primary Examiner* — Stephen E. Jones
(74) *Attorney, Agent, or Firm* — SOLARIS Intellectual Property Group, PLLC

(57) ABSTRACT

A waveguide structure includes at least one transmission line and at least one conductive pattern layer. At least a portion of the transmission line and at least a portion of the conductive pattern layer overlap each other as observed from a surface side of the conductive pattern layer. A surface electrical resistance value of the conductive pattern layer is in a range of 0.005Ω/☐ to 30Ω/☐.

11 Claims, 9 Drawing Sheets

Related U.S. Application Data

(60) Provisional application No. 62/952,481, filed on Dec. 23, 2019.

(51) Int. Cl.
*H01P 7/08* (2006.01)
*H01P 11/00* (2006.01)
*H05K 9/00* (2006.01)

(58) Field of Classification Search
CPC .......... H01P 3/081; H01P 3/085; H01P 3/088; H01P 3/082; H01P 11/001; H05K 9/0079; H05K 9/0081
See application file for complete search history.

(56) References Cited

U.S. PATENT DOCUMENTS

| | | |
|---|---|---|
| 2011/0122596 A1 | 5/2011 | Miyazaki et al. |
| 2012/0286897 A1 | 11/2012 | Smith et al. |
| 2015/0116187 A1 | 4/2015 | Smith et al. |
| 2015/0180133 A1 | 6/2015 | Hunt et al. |
| 2018/0069318 A1 | 3/2018 | Smith et al. |

FOREIGN PATENT DOCUMENTS

| | | |
|---|---|---|
| JP | 2011-066094 A | 3/2011 |
| JP | 2011-124536 A | 6/2011 |
| JP | 2011-172281 A | 9/2011 |
| JP | 2011-204732 A | 10/2011 |
| JP | 2015-043617 A | 3/2015 |
| KR | 10-2018-0134034 A | 12/2018 |

OTHER PUBLICATIONS

International Search Report issued in International Application No. PCT/JP2020/038187 on Dec. 15, 2020.
Written Opinion of the ISA issued in International Application No. PCT/JP2020/038187 on Dec. 15, 2020.
Written Opinion of the IPEA issued in International Application No. PCT/JP2020/038187 on Jun. 29, 2021.
International Preliminary Report on Patentability issued in International Application No. PCT/JP2020/038187 on Oct. 26, 2021.
English language translation of the following: Office action dated May 1, 2024 from the SIPO in a Chinese patent application No. 202080083736.3 corresponding to the instant patent application.
English language translation of the following: Office action dated Aug. 2, 2023 from the SIPO in a Chinese patent application No. 202080083736.3 corresponding to the instant patent application.
English language translation of the following: Office action dated Dec. 26, 2023 from the SIPO in a Chinese patent application No. 202080083736.3 corresponding to the instant patent application.
English language translation of the following: Office action dated Mar. 22, 2023 from the JPO in a Japanese patent application No. 2021-566833 corresponding to the instant patent application.

* cited by examiner

WAVEGUIDE STRUCTURE AND METHOD FOR MANUFACTURING WAVEGUIDE STRUCTURE

CROSS-REFERENCE TO RELATED APPLICATIONS

This application is a continuation application of International Application No. PCT/JP2020/038187, filed Oct. 8, 2020, the disclosure of which is incorporated herein by reference in its entirety. Further, this application claims priority from U.S. Provisional Patent Application No. 62/952,481, filed Dec. 23, 2019, the disclosure of which is incorporated herein by reference in its entirety.

TECHNICAL FIELD

The present disclosure relates to a waveguide structure and a method for manufacturing the waveguide structure.

BACKGROUND ART

In electronic devices, such as mobile phones, notebook computers, and digital cameras, unnecessary radiation of electromagnetic waves in a high frequency range, that is, so-called electromagnetic wave noise, has become a problem due to, for example, high-density mounting of electronic components or an increase in clock speed.

In the related art, a noise suppression sheet is known which absorbs electromagnetic waves propagated through a line using a magnetic loss material or a dielectric loss material to suppress unnecessary radiation. However, the noise suppression sheet needs to have a length on the order of wavelength, for example, a length of several centimeters in order to efficiently absorb electromagnetic waves, and it is difficult to mount the noise suppression sheet on a printed substrate in which components are disposed at high density.

A method using a metamaterial that responds to electromagnetic waves is known as another method for suppressing the unnecessary radiation of electromagnetic waves. For example, Patent Reference 1 discloses a waveguide structure in which a complementary metamaterial resonance element (for example, a split ring resonator) is embedded in a boundary conductive surface of a flat waveguide.

[Patent Reference 1] JP2015-43617A

DISCLOSURE OF THE INVENTION

Problem that the Invention is to Solve

The complementary metamaterial resonance element disclosed in Patent Reference 1 has a high reflectance of electromagnetic wave noise, but has a low absorption rate of electromagnetic wave noise and is not capable of sufficiently absorbing the electromagnetic wave noise. Therefore, there is a demand for a waveguide structure that can suitably absorb electromagnetic wave noise propagated through a transmission line.

The invention has been made in view of the above circumstances, and an object of an embodiment of the invention is to provide a waveguide structure that can suitably absorb electromagnetic wave noise propagated through a transmission line and a method for manufacturing the same.

Means for Solving the Problem

Means for solving the above problems include the following embodiments.

<1> There is provided a waveguide structure comprising at least one transmission line and at least one conductive pattern layer. At least a portion of the transmission line and at least a portion of the conductive pattern layer overlap each other as observed from a surface side of the conductive pattern layer, and a surface electrical resistance value of the conductive pattern layer is in a range of 0.005Ω/□ to 30 Ω/□.

<2> In the waveguide structure according to <1>, at least a portion of the conductive pattern layer and at least a portion of the transmission line may come into contact with each other.

<3> In the waveguide structure according to <1>, the conductive pattern layer may not come into contact with the transmission line, and a shortest distance between the conductive pattern layer and the transmission line may be equal to or less than 1000 μm. The waveguide structure may further comprise a dielectric layer between the conductive pattern layer and the transmission line.

<4> In the waveguide structure according to any one of <1> to <3>, the conductive pattern layer may have a thin line structure, a meander structure, or a spiral structure.

<5> In the waveguide structure according to any one of <1> to <4>, a conductive material included in the conductive pattern layer may be at least one selected from the group consisting of a metal material, a carbon material, an oxide material, and an organic conductive material.

<6> In the waveguide structure according to any one of <1> to <5>, at least a portion of the transmission line and at least a portion of the conductive pattern layer may overlap each other at two or more positions as observed from the surface side of the conductive pattern layer.

<7> In the waveguide structure according to any one of <1> to <6>, the conductive pattern layer may selectively absorb an electromagnetic wave having a specific frequency generated in a case in which a current flows through the transmission line.

<8> In the waveguide structure according to any one of <1> to <7>, the conductive pattern layer may have a peak of an absorption rate for an electromagnetic wave having a specific frequency generated in a case in which a current flows through the transmission line, and a half-width (GHz) of a peak absorption rate for a frequency f (GHz) of the peak absorption rate may be equal to or less than 2.0/f.

<9> In the waveguide structure according to any one of <1> to <8>, the conductive pattern layer may be formed of a conductive ink.

<10> In the waveguide structure according to <9>, the conductive ink may be a particle-free conductive ink.

<11> There is provided a method for manufacturing the waveguide structure according to any one of <1> to <10>. The method comprises a step of forming the conductive pattern layer to overlap at least a portion of the transmission line as observed from a surface side of the conductive pattern layer. The conductive pattern layer is formed by a printing method.

<12> In the method for manufacturing the waveguide structure according to <11>, the printing method may be an inkjet printing method.

Advantage of the Invention

According to an embodiment of the invention, there is provided a waveguide structure that can absorb electromagnetic wave noise propagated through a transmission line and a method for manufacturing the same.

BEST MODE FOR CARRYING OUT THE INVENTION

Figure 1:
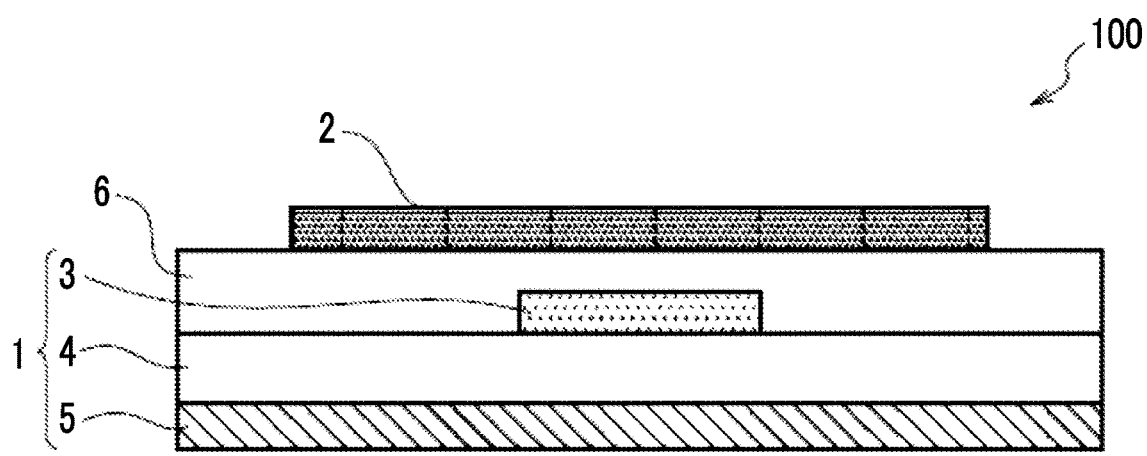
FIG. 1 is a cross-sectional view illustrating a configuration of a waveguide structure according to the present disclosure.

Hereinafter, embodiments of a waveguide structure and a method for manufacturing the same will be described. However, the invention is not limited to the following embodiments and can be appropriately modified within the scope of the object of the invention.

A numerical range indicated by using "to" in the present disclosure means a range including numerical values before and after "to" as a minimum value and a maximum value, respectively.

In the numerical range described stepwise in the present disclosure, an upper limit value or a lower limit value described in a certain numerical range may be replaced with an upper limit value or a lower limit value of another numerical range described stepwise. Further, in the numerical range described in the present disclosure, the upper limit value or the lower limit value described in a certain numerical range may be replaced with values described in Examples.

Each element in each of the drawings illustrated in the present disclosure is not necessarily drawn to scale with a focus on clearly illustrating the principles of the present disclosure, and some elements are illustrated with emphasis.

In the present disclosure, "observation from a surface side of a conductive pattern layer" is a point of view from a normal direction to a main surface of the conductive pattern layer. An angle formed between a straight line connecting a portion of a transmission line which overlaps at least a portion of the conductive pattern layer and the above-mentioned point of view and the main surface of the conductive pattern layer is not limited to 90° and may be, for example, in a range of 80° to 100°.

[Waveguide Structure]

A waveguide structure according to the present disclosure comprises at least one transmission line and at least one conductive pattern layer. As observed from a surface side of the conductive pattern layer, at least a portion of the transmission line and at least a portion of the conductive pattern layer overlap each other, and a surface electrical resistance value of the conductive pattern layer is in a range of 0.005Ω/□ to 30 Ω/□.

In general, in a waveguide structure, such as a printed substrate, a copper foil having a thickness of 18 μm or more is used to reduce electromagnetic wave noise. In this case, the surface electrical resistance value of the copper foil is equal to or less than 0.001Ω/□, which is significantly different from the surface electrical resistance value of the conductive pattern layer applied to the waveguide structure according to the present disclosure. In a case in which this copper foil is applied to the waveguide structure, the copper foil is not capable of efficiently absorbing the electromagnetic wave noise, and a reduction in the electromagnetic wave noise is insufficient. In addition, even in a case in which a member used to reduce the electromagnetic wave noise has a relatively large surface electrical resistance value of about 100Ω/□, there is a problem that it is difficult to efficiently absorb the electromagnetic wave noise.

In contrast, in the waveguide structure according to the present disclosure, as observed from the surface side of the conductive pattern layer, at least a portion of the transmission line and at least a portion of the conductive pattern layer overlap each other such that the electromagnetic wave noise transmitted through the transmission line is moved to the conductive pattern layer. In addition, the surface electrical resistance value of the conductive pattern layer is in the range of 0.005Ω/□ to 30Ω/□, which makes it possible to efficiently absorb the moved electromagnetic wave noise with the conductive pattern layer.

(Transmission Line)

The waveguide structure according to the present disclosure comprises at least one transmission line. The transmission line is not particularly limited as long as it has a wiring line for transmitting an electromagnetic wave, which is a signal, from one point to another point. Examples of the transmission line include a microstrip line, a strip line, a slot line, and a coplanar waveguide.

(Conductive Pattern Layer)

The waveguide structure according to the present disclosure comprises at least one conductive pattern layer. As observed from the surface side of the conductive pattern layer, at least a portion of the transmission line and at least a portion of the conductive pattern layer overlap each other, and the surface electrical resistance value of the conductive pattern layer is in the range of 0.005Ω/□ to 30 Ω/□.

It is preferable that at least a portion of the conductive pattern layer overlaps at least a portion of the wiring line in the transmission line as observed from the surface side of the conductive pattern layer. Further, at least a portion of the conductive pattern layer and at least a portion of the transmission line may come into contact with each other. In addition, the conductive pattern layer and the transmission line may not come into contact with each other, and a dielectric layer may be provided between the conductive pattern layer and the transmission line, which will be described below.

The surface electrical resistance value of the conductive pattern layer is preferably 0.007Ω/□ to 15Ω/□, more preferably 0.01Ω/□ to 5Ω/□, and most preferably 0.01Ω/□ to 2Ω/□ from the viewpoint of efficiently absorbing the electromagnetic wave noise. The surface electrical resistance value of the conductive pattern layer can fall within the above-mentioned numerical range by appropriately adjusting, for example, the thickness of the conductive pattern layer, a conductive material included in the conductive pattern layer, and the conductivity of the conductive pattern layer.

It is preferable that the conductive pattern layer has a resonance structure which resonates with an electromagnetic wave having at least one frequency included in a specific frequency range. In this case, it possible to increase the amount of electromagnetic wave noise in a specific frequency range which is moved to the conductive pattern layer and is absorbed by the conductive pattern layer.

It is preferable that the conductive pattern layer selectively absorbs the electromagnetic wave having a specific frequency generated in a case in which a current flows through the transmission line. In this case, it is possible to efficiently absorb electromagnetic wave noise having a specific frequency. Here, "selectively absorbing an electromagnetic wave having a specific frequency" means that the conductive pattern layer has a peak electromagnetic wave absorption rate at a specific frequency.

Further, it is preferable that the conductive pattern layer has a resonance structure which resonates with an electromagnetic wave having a specific frequency to selectively absorb the electromagnetic wave noise having a specific frequency generated in a case in which a current flows through the transmission line.

It is preferable that the conductive pattern layer has a peak absorption rate for the electromagnetic wave having a specific frequency generated in a case in which a current flows through the transmission line and the half-width (GHz) of the peak absorption rate for a frequency f (GHz) of the peak absorption rate is equal to or less than 2.0/f. This makes it possible to efficiently absorb electromagnetic wave noise in a specific frequency range. In the present disclosure, the half-width of the peak absorption rate is a frequency width at half the peak height and means the full width at half maximum (FWHM).

The half-width of the peak absorption rate may be equal to or less than 2.0/f or equal to or less than 1.0/f. The lower limit of the half-width of the peak absorption rate is not particularly limited and may be, for example, equal to or greater than 0.6/f.

The half-width of the peak absorption rate may be in the range of 0.2 GHz to 1.0 GHz or in the range of 0.25 GHz to 0.8 GHz.

The conductive pattern layer has the peak of the absorption rate for the electromagnetic wave having a specific frequency generated in a case in which a current flows through the transmission line, and the peak absorption rate is preferably equal to or greater than 13%, more preferably equal to or greater than 20%, further more preferably equal to or greater than 40%, and particularly preferably equal to or greater than 50%. The upper limit of the peak absorption rate is not particularly limited as long as it is equal to or less than 100% and may be, for example, equal to or less than 95%.

The electromagnetic wave absorption rate and the half-width of the peak absorption rate can be measured using a commercially available network analyzer.

A conductive pattern layer having a resonance structure that resonates with an electromagnetic wave having a specific frequency, a conductive pattern layer that selectively absorbs the electromagnetic wave having the specific frequency, and a conductive pattern layer which has the peak of the absorption rate for the electromagnetic wave having the specific frequency and in which the half-width of the peak absorption rate is equal to or less than 2.0/f are obtained by appropriately adjusting, for example, the shape, length, width, and material of the conductive pattern layers.

The length of the conductive pattern layer is preferably in the range of 5 mm to 100 mm and more preferably in the range of 10 mm to 50 mm from the viewpoint of making it easy to form the conductive pattern layer having the resonance structure that resonates with electromagnetic waves in a specific frequency range.

In a case in which the conductive pattern layer has a thin line structure which will be described below, the length of the conductive pattern layer is preferably equal to or greater than 10 mm, more preferably equal to or greater than 15 mm, and most preferably equal to or greater than 22 mm from the viewpoint of efficiently absorbing electromagnetic wave noise. In a case in which the conductive pattern layer has the thin line structure which will be described below, the length of the conductive pattern layer may be equal to or less than 100 mm. In addition, as illustrated in (b) of FIG. 3, in a case in which a conductive pattern layer having a thin line structure that extends on both sides in a width direction of the wiring line is formed, it is preferable that the length of the conductive pattern layer on at least one side in the width direction (the length of the conductive pattern layer extending from the center of the width of the wiring line to one side in the width direction) satisfies the above-mentioned numerical range. It is more preferable that the lengths of the conductive pattern layer on both sides in the width direction independently satisfy the above-mentioned numerical range.

The width of the conductive pattern layer is preferably in the range of 0.1 mm to 5 mm and more preferably in the range of 0.2 mm to 3 mm, from the viewpoint of making it easy to form the conductive pattern layer having the resonance structure that resonates with electromagnetic waves in a specific frequency range.

The specific frequency range is not particularly limited and may be, for example, a range of $10^8$ Hz to $10^{11}$ Hz (0.1 GHz to 100 GHz) or a range of $10^8$ Hz to $10^{10}$ Hz (0.1 GHz to 10 GHz).

Examples of the shape of the conductive pattern layer include a thin line structure, a meander structure, a spiral structure, and a split ring structure since the conductive pattern layer can have the resonance structure that resonates with electromagnetic waves in a specific frequency range. It is preferable that the shape of the conductive pattern layer is the meander structure or the spiral structure from the viewpoint of efficiently absorbing electromagnetic wave noise. In addition, the shape of the conductive pattern layer is not limited thereto and may be, for example, other shapes that can have the above-mentioned resonance structure.

The waveguide structure according to the present disclosure may comprise at least one conductive pattern layer, and the number of conductive pattern layers is not particularly limited. The number of conductive pattern layers is preferably two or more and more preferably two to four from the viewpoint of efficiently absorbing electromagnetic wave noise. In a case in which the waveguide structure according to the present disclosure comprises two or more conductive pattern layers, the shapes of the two or more conductive pattern layers may be the same or different. The waveguide structure according to the present disclosure may comprise, for example, two or more thin line structures, two or more meander structures, two or more spiral structures, and two or more split ring structures, and these structures may be the same or different.

In the waveguide structure according to the present disclosure, as observed from the surface side of the conductive pattern layer, at least a portion of the transmission line and at least a portion of the conductive pattern layer may overlap each other. The number of positions where the portions overlap each other is not particularly limited. The number of positions where at least a portion of the transmission line and at least a portion of the conductive pattern layer overlap each other is preferably two or more and more preferably two to four from the viewpoint of efficiently absorbing electromagnetic wave noise.

The conductive pattern layer includes a conductive material. The conductive material included in the conductive pattern layer is preferably at least one selected from the group consisting of a metal material, a carbon material, an oxide material, and an organic conductive material, is more preferably at least one selected from the group consisting of a metal material, a carbon material, and an oxide material, and is further preferably at least one selected from the group consisting of a metal material and a carbon material from the viewpoint of efficiently absorbing electromagnetic wave noise.

The conductivity of the conductive material is not particularly limited as long as the surface electrical resistance value of the conductive pattern layer can be adjusted to $0.005\Omega/\square$ to $30\Omega/\square$ in a case in which the conductive material is used to form the conductive pattern layer. For example, it is preferable that the conductivity of the conductive material is equal to or greater than 3000 S/m from the viewpoint of reducing the thickness of the conductive pattern layer and facilitating the production of the conductive pattern layer.

The conductive material is not particularly limited as long as the surface electrical resistance value of the conductive pattern layer can be adjusted to $0.005\Omega/\square$ to $30\Omega/\square$ in a case in which the conductive material is used to form the conductive pattern layer. Examples of the conductive material include metal materials, such as platinum, gold, silver, and copper, carbon materials, such as graphite and carbon nanotubes, and oxide materials, such as copper oxide and indium tin oxide (ITO). One kind of material may be used alone or a combination of two or more kinds of materials may be used as the conductive material.

The conductive pattern layer may be formed of conductive ink. The conductive ink means a precursor liquid capable of forming a conductive layer by burning an ink layer. The conductive ink used to form the conductive pattern layer is not particularly limited as long as it is ink capable of forming a conductive pattern layer having a surface electrical resistance value of $0.005\Omega/\square$ to $30\Omega/\square$ after burning. Examples of the conductive ink include nanoparticle-containing conductive inks, such as platinum nanoparticle ink, gold nanoparticle ink, silver nanoparticle ink, copper nanoparticle ink, and copper oxide nanoparticle ink, particle-free conductive inks, such as ionic non-particle gold ink, ionic non-particle silver ink, and ionic non-particle copper ink, silver nanowire ink, ITO ink, graphite ink, carbon nanotube ink, mixtures thereof, and combinations thereof. Among them, from the viewpoint of high water resistance, a surface electrical resistance value in a thin film, and availability, the nanoparticle-containing conductive ink and the particle-free conductive ink are preferable, and the platinum nanoparticle ink, the gold nanoparticle ink, the silver nanoparticle ink, the copper nanoparticle ink, the ionic non-particle gold ink, the ionic non-particle silver ink, and the ionic non-particle copper ink are more preferable. From the viewpoint of sinterability at a low temperature, the particle-free conductive ink is preferable, and the ionic non-particle gold ink, the ionic non-particle silver ink, and the ionic non-particle copper ink are more preferable.

The particle-free conductive ink may be an ink that contains a component which becomes a conductive material by being reduced, such as a metal ion, and substantially does not contain a conductive particle. For example, EI-702 manufactured by Electroninks Incorporated, TEC-IJ-010 manufactured by InkTec Co., Ltd., and Non-particle Ink manufactured by Liquid X can be used.

(Dielectric Layer)

In the waveguide structure according to the present disclosure, the conductive pattern layer and the transmission line may not come into contact with each other, and a dielectric layer may be further provided between the conductive pattern layer and the transmission line. In a case in which the dielectric layer is present, it is preferable that the shortest distance between the conductive pattern layer and the transmission line is equal to or less than 1000 that is, the minimum value of the thickness of the dielectric layer located between the conductive pattern layer and the transmission line is equal to or less than 1000 µm from the viewpoint of reducing the thickness of the waveguide structure and efficiently absorbing electromagnetic wave noise.

In a case in which the dielectric layer is present, the shortest distance between the conductive pattern layer and the transmission line may be in the range of 10 µm to 800 µm or in the range of 30 µm to 600 µm.

An example of the dielectric layer is a layer including, for example, a dielectric inorganic compound or a dielectric organic compound.

Examples of the inorganic compound include silica, quartz, glass, silicon nitride, titania, alumina, aluminum nitride, zinc oxide, germanium oxide, zirconium oxide, niobium oxide, molybdenum oxide, indium oxide, tin oxide, tantalum oxide, tungsten oxide, lead oxide, diamond, boron nitride, carbon nitride, aluminum oxynitride, and silicon oxynitride.

Examples of the organic compound include polycarbonate, polyethylene terephthalate, polybutylene terephthalate, polyethylene naphthalate, polymethylmethacrylate, polystyrene, methylstyrene resin, acrylonitrile butadiene styrene (ABS) resin, acrylonitrile styrene (AS) resin, polyethylene, polypropylene, polymethylpentene, polyoxetane, nylon 6, nylon 66, polyvinyl chloride, polyethersulfone, polysulfone, cellulose triacetate, polyvinyl alcohol, polyacrylonitrile, cyclic polyolefin, acrylic resin, epoxy resin, cyclohexadiene polymer, amorphous polyester resin, polyimide, polyurethane, fluororesin, thermoplastic elastomer, and polylactic acid.

FIG. 1 illustrates example 1 of the positional relationship between the conductive pattern layer and the transmission line in the waveguide structure according to the present disclosure. A waveguide structure 100 illustrated in FIG. 1 has a transmission line 1 having a microstrip line structure, a second dielectric layer 6, and a conductive pattern layer 2 in this order, and a wiring line 3 constituting the transmission line 1 does not come into contact with the conductive pattern layer 2. The transmission line 1 has the wiring line 3, a first dielectric layer 4, and a metal plane layer 5 in this order as observed from the conductive pattern layer 2. As observed from the surface side of the conductive pattern layer 2, at least a portion of the transmission line 1 and at least a portion of the conductive pattern layer 2 overlap each other.

The wiring line 3 and the metal plane layer 5 are not particularly limited as long as they are conductors through which a current (particularly, a high-frequency current) flows. The wiring line 3 and the metal plane layer 5 may be, for example, conductors including copper or the like.

The first dielectric layer 4 is the same as the preferred form of the dielectric layer provided between the conductive pattern layer and the transmission line. The second dielectric layer 6 corresponds to the dielectric layer provided between the conductive pattern layer and the transmission line.

Figure 2:
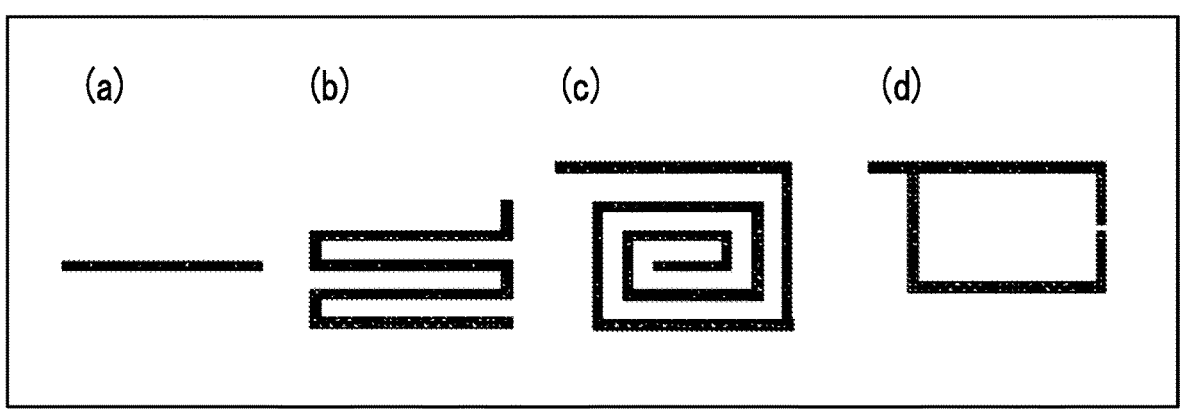
FIG. 2 is a schematic configuration diagram illustrating conductive pattern layers having a thin line structure, a meander structure, a spiral structure, and a split ring structure.

FIG. 2 illustrates examples of the shape of the conductive pattern layer. In FIG. 2, (a) illustrates an example of the thin line structure, (b) illustrates an example of the meander structure, (c) illustrates an example of the spiral structure, and (d) illustrates an example of the split ring structure.

Figure 3:
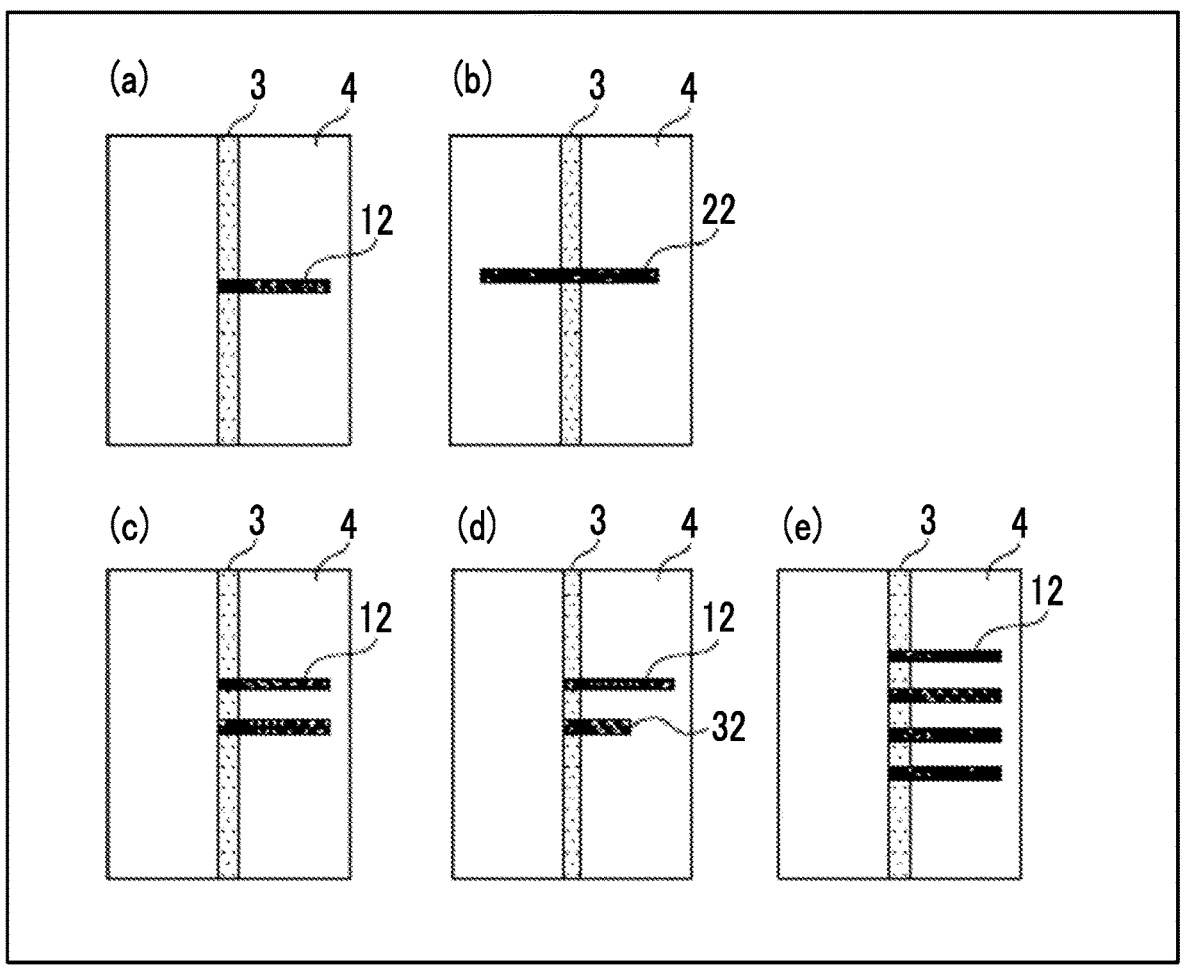
FIG. 3 is a schematic configuration diagram illustrating examples of a positional relationship between the conductive pattern layer and a transmission line in a case in which a shape of the conductive pattern layer is the thin line structure.

FIG. 3 illustrates examples of the positional relationship between the conductive pattern layer and the transmission line in a case in which the shape of the conductive pattern layer is the thin line structure in the waveguide structure according to the present disclosure. FIG. 3 illustrates the positional relationship between the conductive pattern layer and the transmission line having the microstrip line structure as observed from the surface side of the conductive pattern layer. However, the transmission line used in the invention is not limited to the microstrip line structure.

In (a) of FIG. 3, the wiring line 3 disposed on the first dielectric layer 4 and a portion of a conductive pattern layer 12 having the thin line structure overlap each other, and the conductive pattern layer 12 that extends only on one side of the wiring line 3 in the width direction is formed.

In (b) of FIG. 3, the wiring line 3 disposed on the first dielectric layer 4 and a portion of a conductive pattern layer 22 having the thin line structure overlap each other, and the conductive pattern layer 22 that extends on both sides of the wiring line 3 in the width direction is formed.

In (c) of FIG. 3, two conductive pattern layers 12 that at least partially overlap the wiring line 3 disposed on the first dielectric layer 4 are provided.

In (d) of FIG. 3, the conductive pattern layer 12 that at least partially overlaps the wiring line 3 disposed on the first dielectric layer 4 and a conductive pattern layer 32 that at least partially overlaps the wiring line 3 disposed on the first dielectric layer 4 and has a smaller length than the conductive pattern layer 12 are provided. The conductive pattern layer 32 extends only on one side of the wiring line 3 in the width direction.

In (e) of FIG. 3, four conductive pattern layers 12 that at least partially overlap the wiring line 3 disposed on the first dielectric layer 4 are provided.

Figure 4:
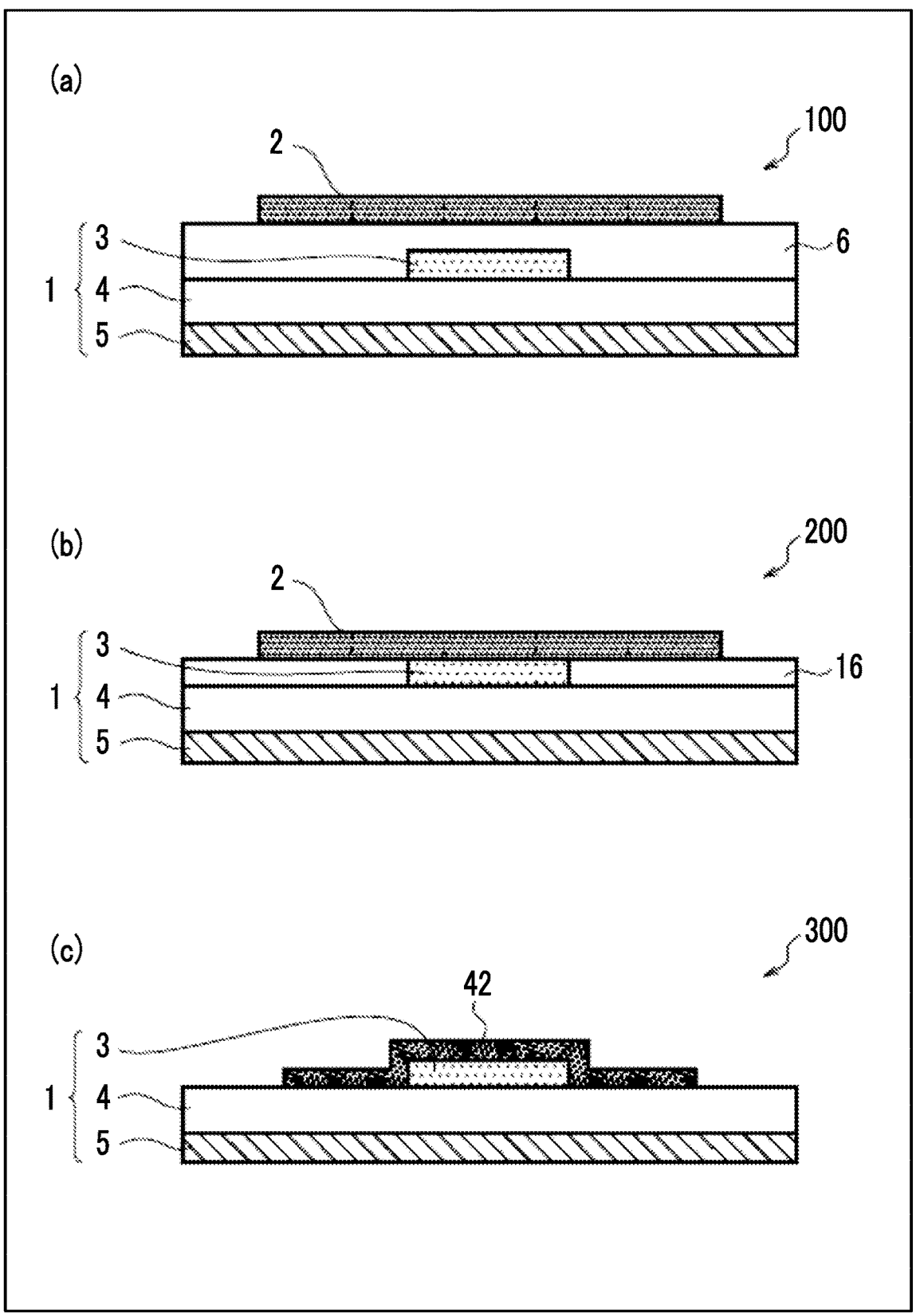
FIG. 4 is a cross-sectional view illustrating a schematic configuration of the waveguide structure according to the present disclosure. (a) is a cross-sectional view illustrating a configuration in which a dielectric layer is provided between the conductive pattern layer and the transmission line, (b) is a cross-sectional view illustrating a configuration in which the dielectric layer is provided and the conductive pattern layer and the transmission line come into contact with each other, and (c) is a cross-sectional view illustrating a configuration in which the dielectric layer is not provided and the conductive pattern layer and the transmission line come into contact with each other.

FIG. 4 illustrates examples 1 to 3 of the positional relationship between the conductive pattern layer and the transmission line in the waveguide structure according to the present disclosure. (a) of FIG. 4 is the same as FIG. 1., and (b) of FIG. 4 illustrates a waveguide structure 200 in which the wiring line 3 constituting the transmission line 1 and the conductive pattern layer 2 come into contact with each other and the wiring line 3 is provided between the first dielectric layer 4 constituting the transmission line 1 and the conductive pattern layer 2. (c) of FIG. 4 illustrates a waveguide structure 300 in which the second dielectric layer is not provided between the transmission line 1 and the conductive pattern layer 2 and a conductive pattern layer 42 is disposed so as to cover the wiring line 3 constituting the transmission line 1.

[Method for Manufacturing Waveguide Structure]

A method for manufacturing a waveguide structure according to the present disclosure is a waveguide structure manufacturing method for manufacturing the waveguide structure according to the present disclosure and includes a step of forming the conductive pattern layer so as to overlap at least a portion of the transmission line as observed from the surface side of the conductive pattern layer.

In the manufacturing method according to the present disclosure, the transmission line is prepared, and the conductive pattern layer is formed so as to overlap at least a portion of the transmission line. Examples of a method for forming the conductive pattern layer include a method for directly forming the conductive pattern layer on the transmission line and a method that forms the conductive pattern layer on a dielectric layer and attaches the dielectric layer, on which the conductive pattern layer has been formed, to the transmission line from the dielectric layer side such that at least a portion of the transmission line and the conductive pattern layer overlap each other.

Examples of the method for forming the conductive pattern layer include known methods, such as printing methods including an inkjet printing method and a screen printing method, a spray coating method, an aerosol jet method, a dispenser method, a photolithography method, a mask vapor deposition method, and a plating method. The method for forming the conductive pattern layer is preferably a printing method and is more preferably an inkjet printing method since it can easily mount the conductive pattern layer on a high-density printed substrate. For example, the method disclosed in JP2010-087146A may be used as a method for forming the conductive pattern layer using the inkjet printing method. Further, in a case in which the conductive pattern layer is formed by the printing method, the above-mentioned conductive ink may be used.

EXAMPLES

Hereinafter, the invention will be described in more detail with reference to Examples. For example, the materials, amounts used, ratios, processing content, and processing procedures described in the following examples can be appropriately changed without departing from the gist of the invention. Therefore, the scope of the invention is not limited to the following specific examples.

Example 1

(Manufacture of Conductive Pattern Layer)

Figure 5:
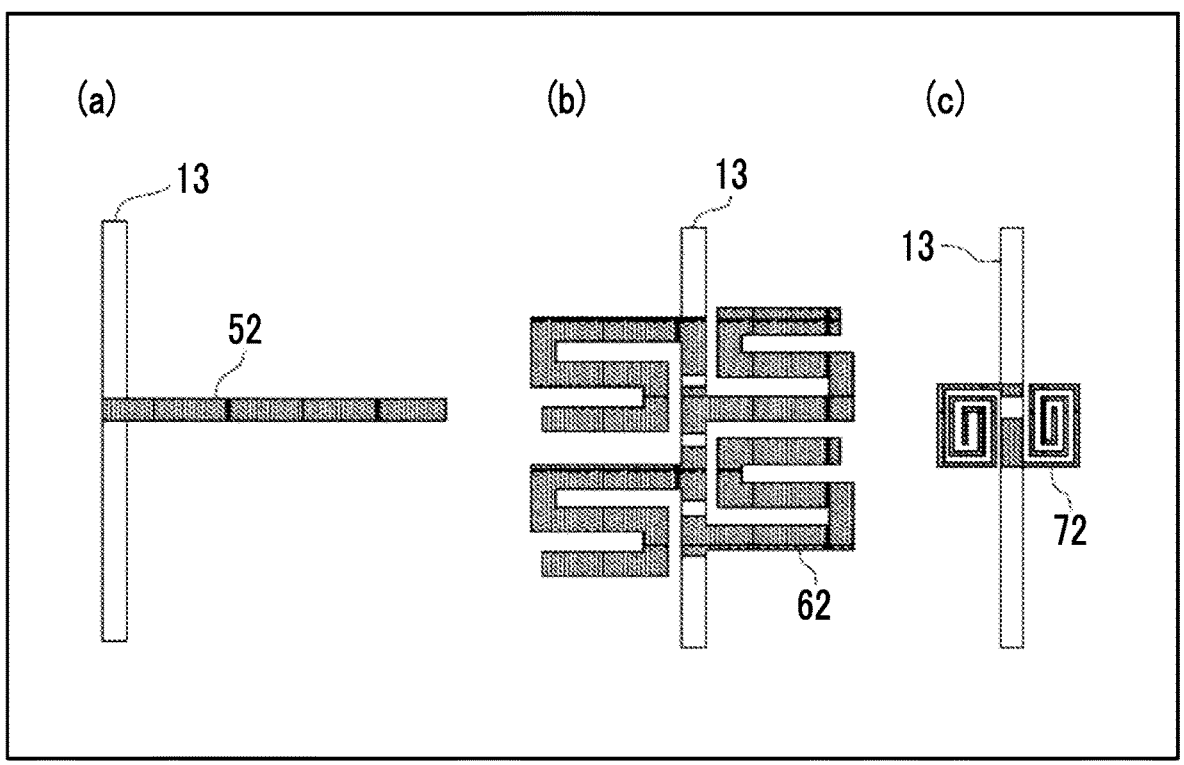
FIG. 5 is a diagram illustrating positional relationships between a conductive pattern layer and a transmission line according to Examples 1 to 3.

Gold was deposited on a PET film having a thickness of 50 μm by an electron beam (EB) vapor deposition method using an aperture mask made of a polyethylene terephthalate (PET) film produced by a laser cutter to manufacture a conductive pattern layer having the thin line structure illustrated in (a) of FIG. 5.

The conductive pattern layer having the thin line structure had a length of 18 mm, a width of 2 mm, and a surface electrical resistance value of 0.2 Ω/□.

(Manufacture of Waveguide Structure)

A fluororesin multilayer substrate with a thickness of 0.5 mm (NPC-H220A manufactured by Nippon Pillar Industry Co., Ltd. comprising, as the transmission line, a microstrip line with a conductor thickness of 18 μm and a conductor line width of 1.6 mm) was used. A film, on which the manufactured conductive pattern layer according to Example 1 was formed, was attached to the wiring line of the transmission line to manufacture a waveguide structure as illustrated in (a) of FIG. 5.

The waveguide structure according to Example 1 included the PET film which was a dielectric layer disposed between the conductive pattern layer and the transmission line, and the shortest distance between the conductive pattern layer and the transmission line was 50 μm.

Example 2

(Manufacture of Conductive Pattern Layer and Manufacture of Waveguide Structure)

Figure 7:
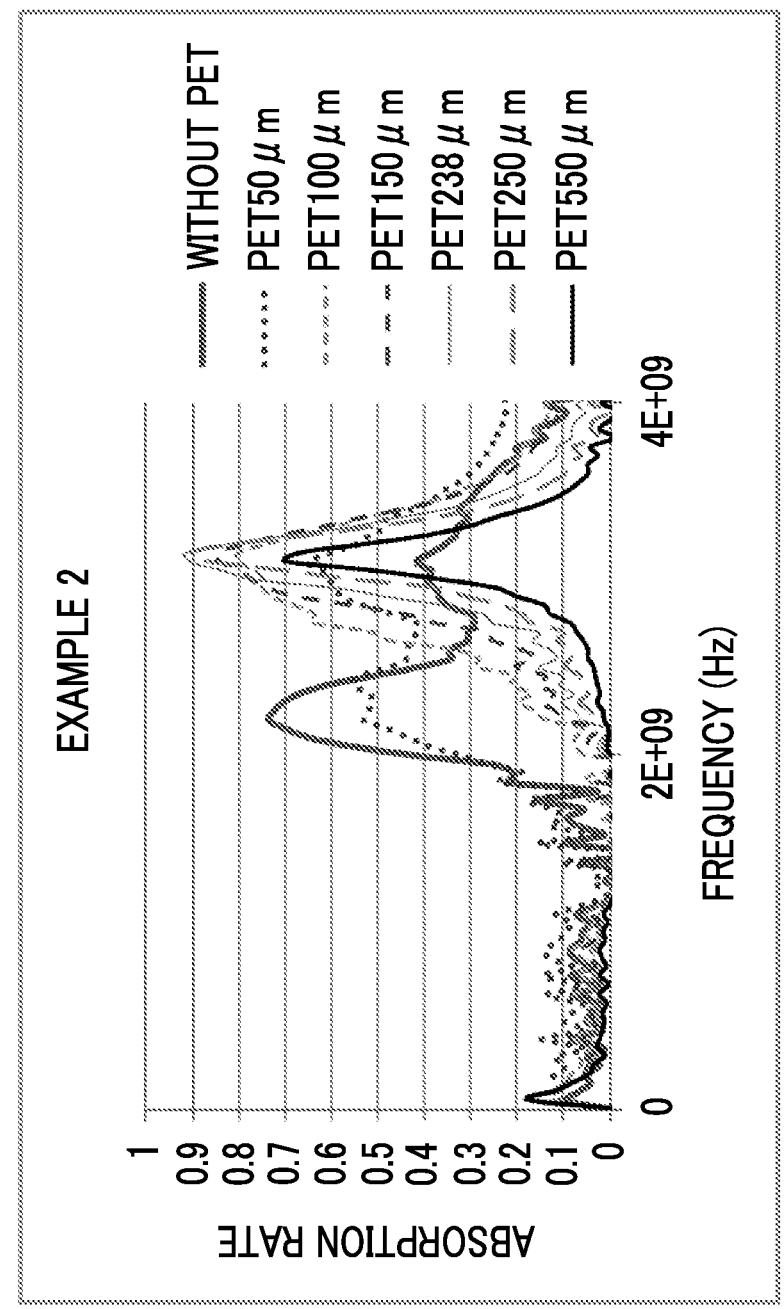
FIG. 7 is a graph illustrating a relationship between the frequency of the electromagnetic wave and the electromagnetic wave absorption rate in a case in which the thickness of PET is changed in Example 2.

Gold was deposited on a PET film having a thickness of 50 μm to 550 μm illustrated in FIG. 7 by an EB vapor deposition method using an aperture mask made of a PET film produced by a laser cutter to manufacture a conductive pattern layer having the meander structure illustrated in (b) of FIG. 5.

One conductive pattern layer having the meander structure had a length of 32 mm, a width of 2 mm, and a surface electrical resistance value of 0.7 Ω/□.

The film on which the conductive pattern layer manufactured in Example 2 was formed was attached to the wiring line of the transmission line of the fluororesin multilayer substrate used in Example 1 as illustrated in (b) of FIG. 5 to manufacture a waveguide structure.

The waveguide structure according to Example 2 had a PET film which was a dielectric layer disposed between the conductive pattern layer and the transmission line, and the shortest distance between the conductive pattern layer and the transmission line was 50 μm to 550 μm.

Further, in Example 2, a waveguide structure was manufactured by depositing gold on the wiring line of the transmission line of the fluororesin multilayer substrate used in Example 1 by the EB vapor deposition method using the aperture mask made of the PET film manufactured by the laser cutter to manufacture a conductive pattern layer having the meander structure illustrated in (b) of FIG. 5. This waveguide structure does not have a dielectric layer between the conductive pattern layer and the transmission line (without PET in FIG. 7).

Example 3

(Manufacture of Conductive Pattern Layer and Manufacture of Waveguide Structure)

An ink layer having the spiral structure illustrated in (c) of FIG. 5 was drawn on a Kapton film (a polyimide film manufactured by Toray DuPont Co., Ltd.) with a thickness of 50 μm under the conditions of a drop amount of 10 pL/drop and a resolution of 605 dots per inch (dpi), using a material printer (DMP-2831) manufactured by FUJIFILM Dimatix, Inc. and a water-based silver nanoparticle ink (SW-1020) manufactured by Bando Chemical Co., Ltd. After the drawing, the ink layer was sintered under the conditions of 300° C. and 30 minutes to manufacture a conductive pattern layer having the spiral structure illustrated in (c) of FIG. 5.

The conductive pattern layer having one spiral structure had a length of 32 mm, a width of 0.4 mm, and a surface electrical resistance value of 0.1 Ω/□.

The film on which the conductive pattern layer manufactured in Example 3 was formed was attached to the wiring line of the transmission line of the fluororesin multilayer substrate used in Example 1 as illustrated in (c) of FIG. 5 to manufacture a waveguide structure.

(Measurement of Electromagnetic Wave Absorption Rate)

S-parameters ($S_{11}$, $S_{21}$) of the waveguide structures manufactured in Examples 1 to 3 were measured with a network analyzer (model number: N5230A) manufactured by Agilent Technologies, Inc, and the electromagnetic wave absorption rate was measured according to the following expression.

Figure 6:
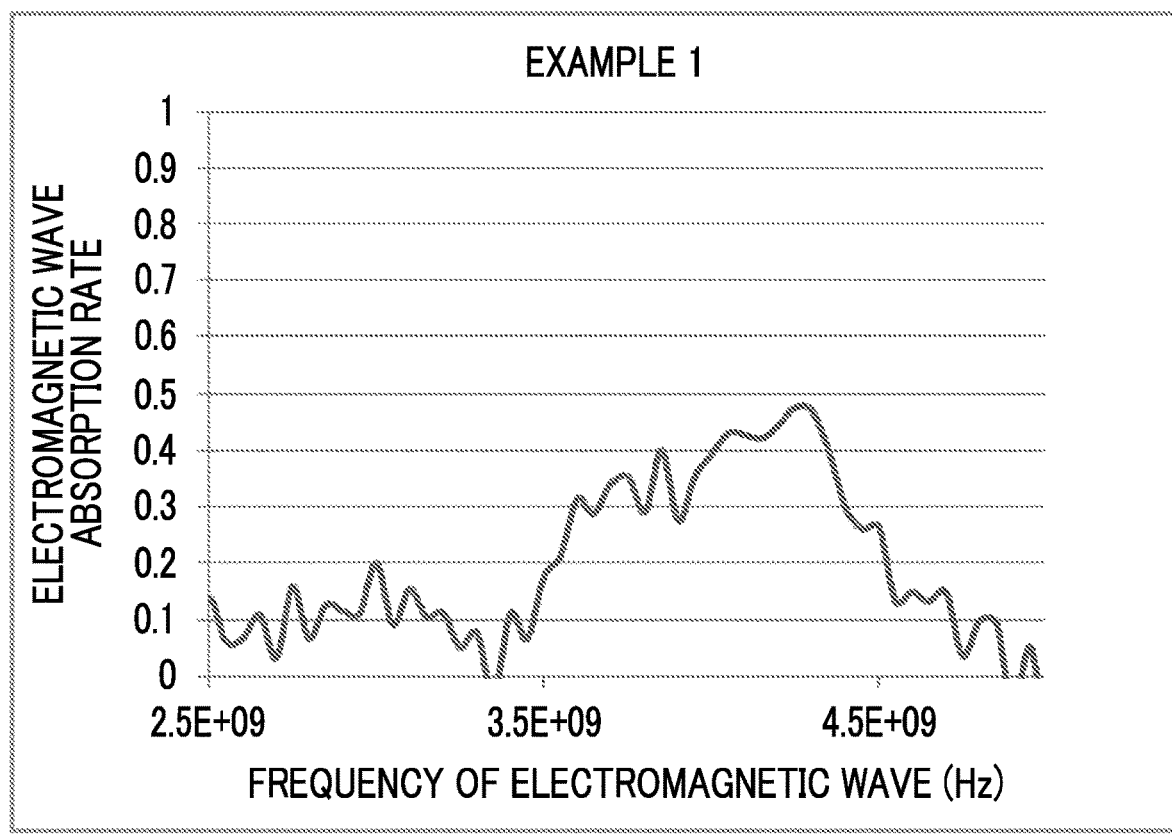
FIG. 6 is a graph illustrating a relationship between a frequency of an electromagnetic wave and an electromagnetic wave absorption rate in Example 1.
Figure 8:
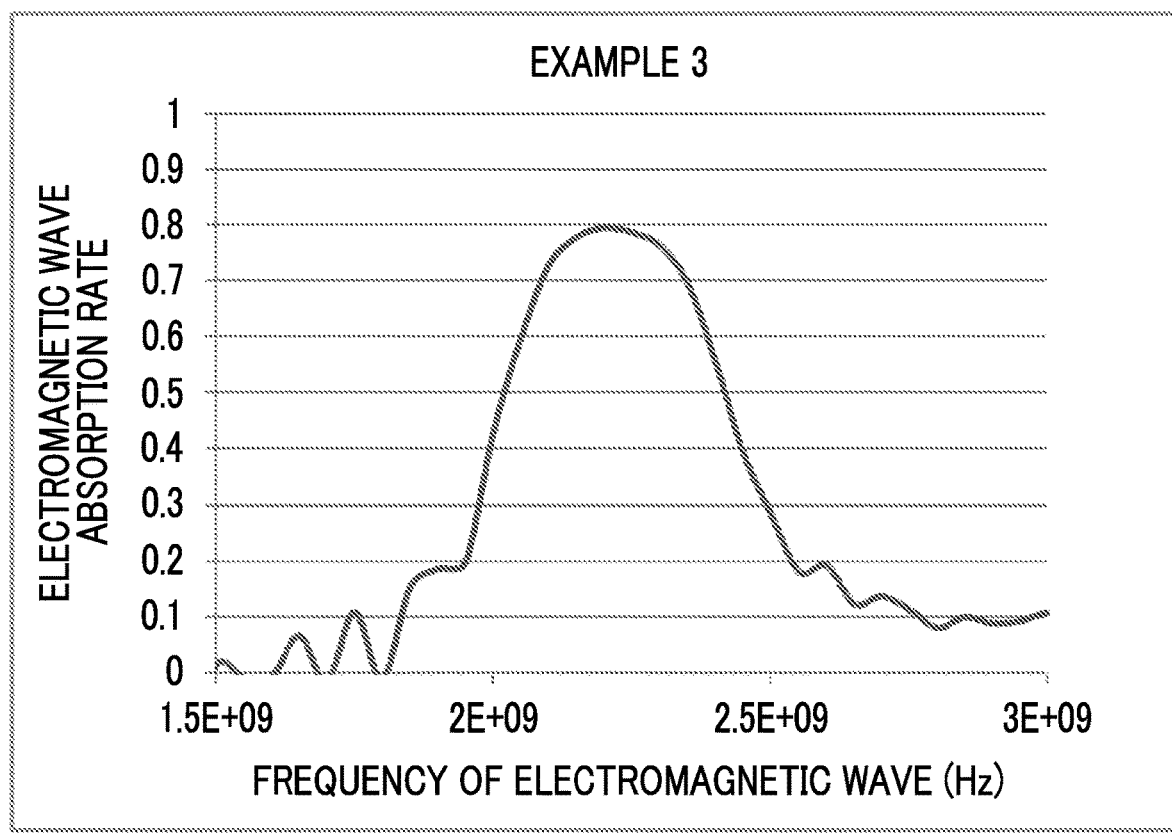
FIG. 8 is a graph illustrating a relationship between the frequency of the electromagnetic wave and the electromagnetic wave absorption rate in Example 3.

The measurement results of the electromagnetic wave absorption rates in Examples 1 to 3 are illustrated in FIGS. 6 to 8. In addition, E in FIGS. 6 to 8 means an exponential part. For example, AE+B means $A \times 10^B$.

$$1 - |S_{11}|^2 - |S_{21}|^2$$

It was confirmed that electromagnetic wave absorption occurred in the waveguide structure including the conductive pattern layer having any one of the thin line structure, the meander structure, or the spiral structure and electromagnetic waves with a specific frequency could be selectively absorbed, as illustrated in FIGS. 6 to 8.

Example 4

The characteristics of a waveguide structure having the same configuration as that in Example 1 were simulated using the finite element method simulation software COMSOL manufactured by Measurement Engineering System Co., Ltd. In addition, the characteristics were similarly evaluated while only the length (L) of the conductive pattern layer having the thin line structure was changed.

Figure 9:
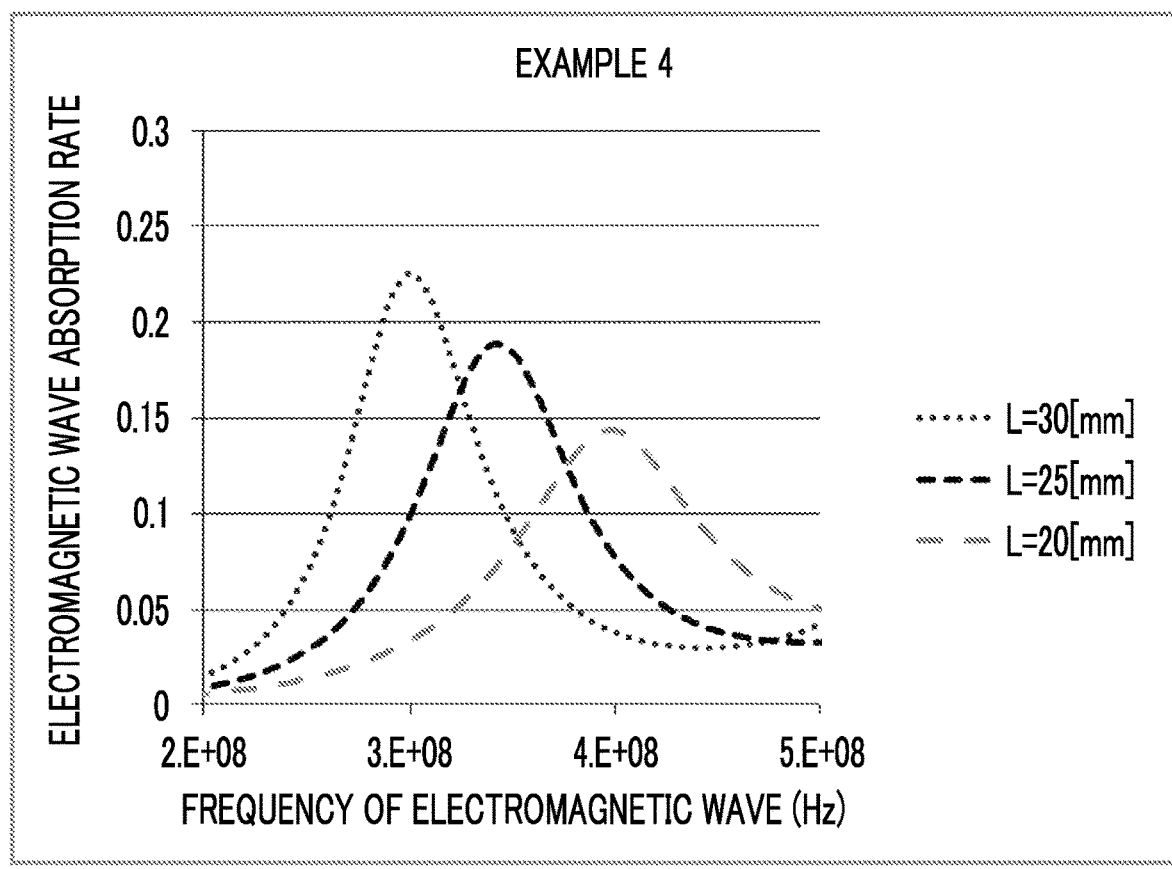
FIG. 9 is a graph illustrating a relationship between the frequency of the electromagnetic wave and the electromagnetic wave absorption rate in a case in which the length of the conductive pattern layer having the thin line structure is changed in a simulation according to Example 4.

The simulation results are illustrated in FIG. 9. It was confirmed that the frequency of the electromagnetic wave selectively absorbed was changed by changing the length of the thin line and the frequency at which the electromagnetic wave was absorbed could be adjusted, as illustrated in FIG. 9.

Example 5

The characteristics of a waveguide structure having the same configuration as that in Example 3 were simulated using the finite element method simulation software COMSOL manufactured by Measurement Engineering System Co., Ltd. In addition, the characteristics were similarly evaluated while only the surface electrical resistance value of the conductive pattern layer having the spiral structure was changed.

Figure 10:
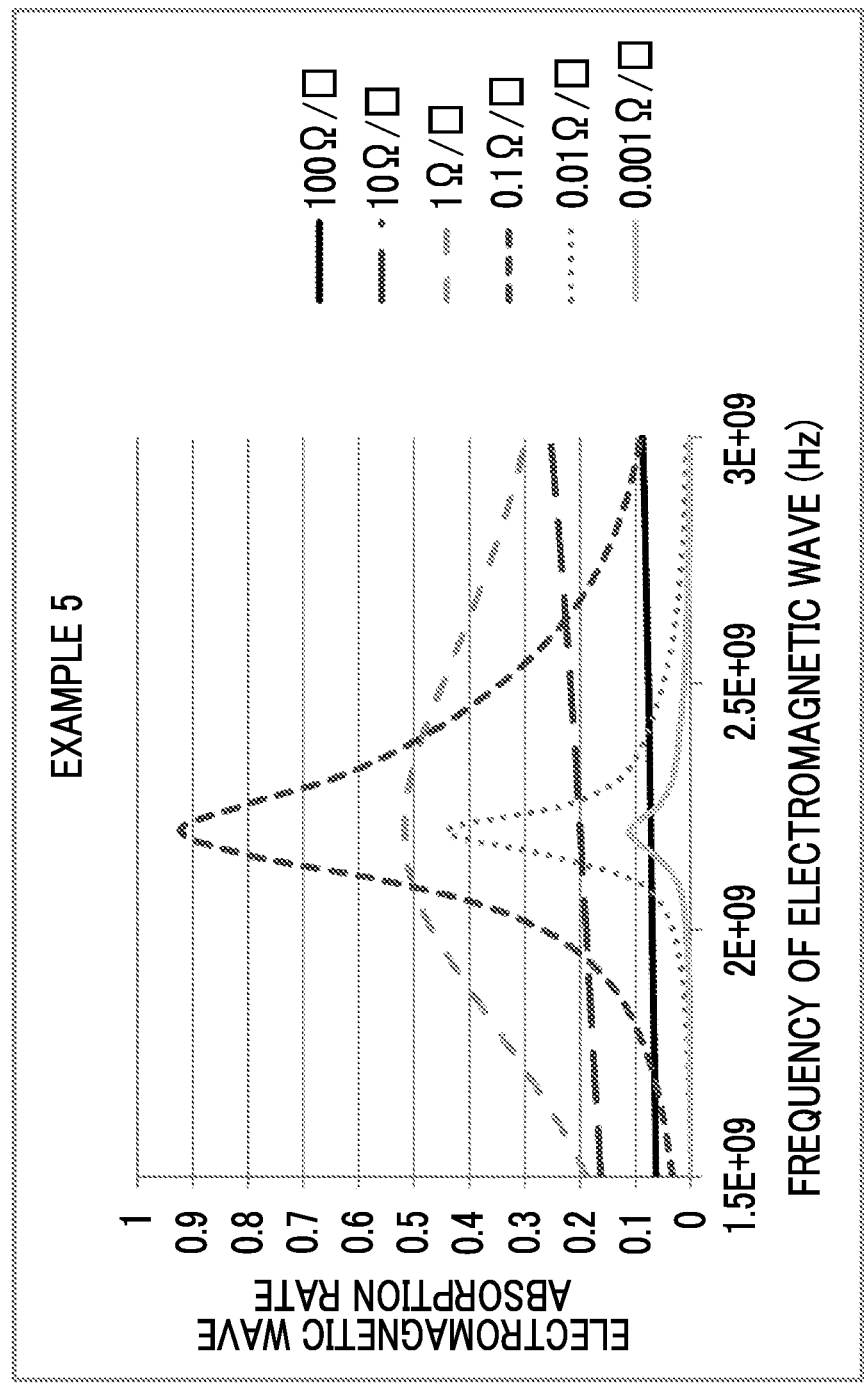
FIG. 10 is a graph illustrating a relationship between the frequency of the electromagnetic wave and the electromagnetic wave absorption rate in a case in which a surface electrical resistance value of the conductive pattern layer having the spiral structure is changed in a simulation according to Example 5.

The simulation results are illustrated in FIG. 10. As illustrated in FIG. 10, it was confirmed that the absorption rate of the electromagnetic waves was high in a case in which the surface electrical resistance value was 0.01 Ω/□, 0.1 Ω/□, 1Ω/□, and 10Ω/□. On the other hand, it was confirmed that, in a case in which the surface electrical resistance value was 0.001Ω/□ or 100Ω/□, the absorption rate of the electromagnetic waves was lower than that in a case in which the surface electrical resistance value was 0.01 Ω/□, 0.1 Ω/□, 1Ω/□, and 10Ω/□, which made it difficult to suitably absorb the electromagnetic wave noise propagated through the transmission line.

Examples 6 to 9

Conductive pattern layers having the spiral structure and waveguide structures according to Examples 6 to 9 were manufactured by the same method as that in Example 3 except that the ink and sintering conditions used for the conductive pattern layer having the spiral structure according to Example 3 and the surface electrical resistance value of the conductive pattern layer were changed as illustrated in the following Table 1. In addition, ink overcoating was performed such that the surface electrical resistance value of the conductive pattern layer was the value illustrated in Table 1.

TABLE 1

|  | Product name | Sintering conditions | Surface electrical resistance value | Ink type |
|---|---|---|---|---|
| Example 3 | SW-1020 (Bando Chemical Industries, LTD.) | 300° C., 30 minutes | 0.1 Ω/□ | Silver particle ink |
| Example 6 | Sicrys ™ I50T-13 (PV nanocell Ltd.) | 180 C., 30 minutes | 0.2 Ω/□ | Silver particle ink |
| Example 7 | EI-702 (Electroninks Incorporated) | 120° C., 30 minutes | 0.15 Ω/□ | Particle-free conductive ink |
| Example 8 | Graphene Ink (Sigma-Aldrich Inc.) | 300° C., 30 minutes | 10 Ω/□ | Carbon ink |
| Example 9 | ITO Ink (ULVAC, Inc.) | 250° C., 30 minutes | 25 Ω/□ | ITO ink |

The electromagnetic wave absorption rates of the waveguide structures according to Examples 6 to 9 were measured in the same manner as that in Example 3, and a peak absorption rate at which the measured value was maximum was calculated. Further, the half-width of the peak absorption rate was calculated using a network analyzer (model number: N5230A) manufactured by Agilent Technologies, Inc. The results are illustrated in Table 2.

TABLE 2

|  | Peak absorption rate | Peak frequency (f) | 2.0/f | Half-width |
|---|---|---|---|---|
| Example 3 | 80% | 2.2 GHz | 0.91 GHz | 0.4 GHz |
| Example 6 | 70% | 2.2 GHz | 0.91 GHz | 0.5 GHz |
| Example 7 | 90% | 2.2 GHz | 0.91 GHz | 0.3 GHz |
| Example 8 | 70% | 2.2 GHz | 0.91 GHz | 0.7 GHz |
| Example 9 | 50% | 2.2 GHz | 0.91 GHz | 0.9 GHz |

As illustrated in Table 2, it was confirmed that the peak absorption rate was high in Example 3 and Examples 6 to 9. In particular, it was confirmed that the peak absorption rate was higher in Example 7 in which the conductive pattern layer was manufactured using a particle-free conductive ink.

The entirety of the disclosure of U.S. Patent Application No. 62/952,481, filed Dec. 23, 2019 is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

REFERENCE SIGNS LIST

1: transmission line
2, 12, 22, 32, 42, 52, 62, 72: conductive pattern layer
3, 13: wiring line
4: first dielectric layer
5: metal plane layer
6, 16: second dielectric layer (dielectric layer)
100: waveguide structure

The invention claimed is:

1. A waveguide structure comprising:
at least one transmission line; and
at least one conductive pattern layer,
wherein at least a portion of the transmission line and at least a portion of the conductive pattern layer overlap each other as observed from a surface side of the conductive pattern layer,
a surface electrical resistance value of the conductive pattern layer is in a range of 0.005Ω/□ to 30Ω/□, and
at least a portion of the conductive pattern layer and at least a portion of the transmission line come into contact with each other.

2. The waveguide structure according to claim 1, wherein the conductive pattern layer has a thin line structure, a meander structure, or a spiral structure.

3. The waveguide structure according to claim 1, wherein a conductive material included in the conductive pattern layer is at least one selected from the group consisting of a metal material, a carbon material, an oxide material, and an organic conductive material.

4. The waveguide structure according to claim 1, wherein at least a portion of the transmission line and at least a portion of the conductive pattern layer overlap each other at two or more positions as observed from the surface side of the conductive pattern layer.

5. The waveguide structure according to claim 1, wherein the conductive pattern layer selectively absorbs an electromagnetic wave having a specific frequency generated in a case in which a current flows through the transmission line.

6. The waveguide structure according to claim 1,
wherein the conductive pattern layer has a peak of an absorption rate for an electromagnetic wave having a specific frequency generated in a case in which a current flows through the transmission line, and
a half-width (GHz) of a peak absorption rate for a frequency f (GHz) of the peak absorption rate is equal to or less than 2.0/f.

7. The waveguide structure according to claim 1,
wherein a width of the conductive pattern layer is in the range of 0.2 mm to 5 mm.

8. The waveguide structure according to claim 1,
wherein the conductive pattern layer is formed of a conductive ink.

9. The waveguide structure according to claim 8,
wherein the conductive ink is a particle-free conductive ink.

10. A method for manufacturing the waveguide structure according to claim 1, the method comprising:
a step of forming the conductive pattern layer to overlap at least a portion of the transmission line as observed from a surface side of the conductive pattern layer, such that at least a portion of the conductive pattern layer and the at least a portion of the transmission line come into contact with each other,
wherein the conductive pattern layer is formed by a printing method.

11. The method for manufacturing the waveguide structure according to claim 10,
wherein the printing method is an inkjet printing method.

* * * * *